(12) United States Patent
Migita et al.

(10) Patent No.: US 11,356,091 B2
(45) Date of Patent: Jun. 7, 2022

(54) DRIVE CIRCUIT

(71) Applicant: TDK CORPORATION, Tokyo (JP)

(72) Inventors: Syoji Migita, Tokyo (JP); Tomohiro Hirano, Tokyo (JP)

(73) Assignee: TDK CORPORATION, Tokyo (JP)

(*) Notice: Subject to any disclaimer, the term of this patent is extended or adjusted under 35 U.S.C. 154(b) by 0 days.

(21) Appl. No.: 17/169,810

(22) Filed: Feb. 8, 2021

(65) Prior Publication Data
US 2021/0250022 A1    Aug. 12, 2021

(30) Foreign Application Priority Data

Feb. 10, 2020 (JP) .............................. JP2020-020756

(51) Int. Cl.
H03K 3/00 (2006.01)
H03K 17/16 (2006.01)
H03K 17/687 (2006.01)
H03K 17/691 (2006.01)
H03K 17/693 (2006.01)

(52) U.S. Cl.
CPC ......... *H03K 17/693* (2013.01); *H03K 17/162* (2013.01); *H03K 17/6871* (2013.01)

(58) Field of Classification Search
None
See application file for complete search history.

(56) References Cited

U.S. PATENT DOCUMENTS

| | | | | |
|---|---|---|---|---|
| 4,438,356 A | * | 3/1984 | Fleischer | H03K 17/691 327/409 |
| 4,461,966 A | * | 7/1984 | Hebenstreit | H03K 17/691 327/432 |
| 4,634,903 A | * | 1/1987 | Montorfano | H02M 3/155 323/283 |
| 4,777,387 A | * | 10/1988 | Collins | H01L 25/074 250/551 |
| 7,113,412 B2 | * | 9/2006 | Shao | H03K 17/04123 327/389 |
| 8,680,837 B2 | * | 3/2014 | Zeng | H03K 17/6877 323/289 |
| 9,985,627 B2 | * | 5/2018 | Hatano | H03K 17/165 |

FOREIGN PATENT DOCUMENTS

JP    2010-051105 A    3/2010

* cited by examiner

Primary Examiner — Kenneth B Wells
(74) Attorney, Agent, or Firm — Oliff PLC

(57) ABSTRACT

A drive circuit capable of inhibiting a drop of a voltage of a drive signal is provided. A drive circuit includes: a drive signal output circuit configured to output a pulse signal input to a gate terminal of a first field effect transistor driving a device; a switching circuit having a switching element that is connected between the gate terminal and the signal output terminal and configured to switch a conduction state between the gate terminal and output terminal; a delay circuit configured to delay an input of the drive signal to the gate terminal by switching a state of the switching element between an on state and an off state; and a reverse flow suppressing unit configured to suppress a reverse flow of a current from the static capacitance to the drive signal output circuit.

20 Claims, 2 Drawing Sheets

DRIVE CIRCUIT

BACKGROUND OF THE INVENTION

Field of the Invention

The present invention relates to a drive circuit.

Priority is claimed on Japanese Patent Application No. 2020-020756, filed Feb. 10, 2020, the content of which is incorporated herein by reference.

Description of Related Art

Drive circuits that drive devices to be controlled, which are targets for control, have been researched and developed.

In relation to this, drive circuits that drive a device to be controlled through field effect transistors are known (for example, see Patent Document 1).

PATENT DOCUMENTS

[Patent Document 1] Japanese Unexamined Patent Application, First Publication No. 2010-051105

SUMMARY OF THE INVENTION

A drive circuit as disclosed in Patent Document 1 drives the device to be controlled by inputting a pulse signal to a gate terminal of the field effect transistor. Here, the drive circuit may include a delay circuit for delaying an input of a pulse signal to the gate terminal. However, when the input is delayed by the delay circuit, there are cases in which a voltage of a pulse signal drops, and the drive circuit is not able to drive the device to be controlled at a desired timing.

The present invention is realized in view of such situations, and an object thereof is to provide a drive circuit capable of inhibiting a drop of a voltage of a drive signal.

According to one aspect of the present invention, there is provided a drive circuit including: a drive signal output circuit configured to output a pulse signal input to a gate terminal of a first field effect transistor driving a device, which is a target to be controlled, from a signal output terminal as a drive signal; a switching circuit having a switching element that is connected between the gate terminal and the signal output terminal and configured to switch a conduction state between the gate terminal and the signal output terminal, the switching circuit a holding a static capacitance for applying a voltage corresponding to an accumulated electric charge to a signal terminal of the switching element; a delay circuit configured to delay an input of the drive signal to the gate terminal by switching a state of the switching element between an on state and an off state; and a reverse flow suppressing unit configured to suppress a reverse flow of a current from the static capacitance to the drive signal output circuit.

According to the present invention, a drop of a voltage of a drive signal can be inhibited.

DETAILED DESCRIPTION OF THE INVENTION

Embodiment

Hereinafter, an embodiment of the present invention will be described with reference to the drawings. Here, in the embodiment, a conductor that transmits an electrical signal according to DC (Direct Current) power or an electrical signal according to AC (Alternating Current) power will be referred to as a transmission path in the description. For example, the transmission path may be a conductor printed on a substrate, a conductor such as a conductor formed in a line shape, or any other conductor. In the embodiment, a voltage represents an electric potential difference from an electric potential serving as a predetermined reference, and illustration and description of the electric potential serving as the reference will be omitted. Here, the electric potential serving as the reference may be any electric potential. In the embodiment, as an example, a case in which the electric potential serving as the reference is a ground electric potential will be described. In the embodiment, for the convenience of description, a voltage applied to a gate terminal of a certain field effect transistor will be referred to as a gate voltage of the field effect transistor in the description.

<Overview of Drive Circuit>

First, an overview of a drive circuit according to an embodiment will be described. The drive circuit includes a drive signal output circuit, a switching circuit, a delay circuit, and a reverse flow suppression unit. The drive signal output circuit is a circuit that outputs a pulse signal input to a gate terminal of a first field effect transistor from a signal output terminal as a drive signal. The first field effect transistor is a field effect transistor that drives a device that is a target to be controlled. The switching circuit is connected between the gate terminal and the signal output terminal. The switching circuit is a circuit that has a switching element. The switching element performs switching of a conduction state between the gate terminal and the signal output terminal. The switching circuit holds a static capacitance for applying a voltage corresponding to an accumulated electric charge to a signal terminal of the switching element. The delay circuit is a circuit that delays an input of a drive signal to the gate terminal by switching the state of the switching element between an on state and an off state. The reverse flow suppression unit suppresses a reverse flow of a current from the static capacitance to the drive signal output circuit.

In this way, the drive circuit according to the embodiment can suppress a drop of a voltage of the drive signal. Hereinafter, the circuit configuration of the drive circuit will be described in detail.

<Circuit Configuration of Drive Circuit>

Figure 1:
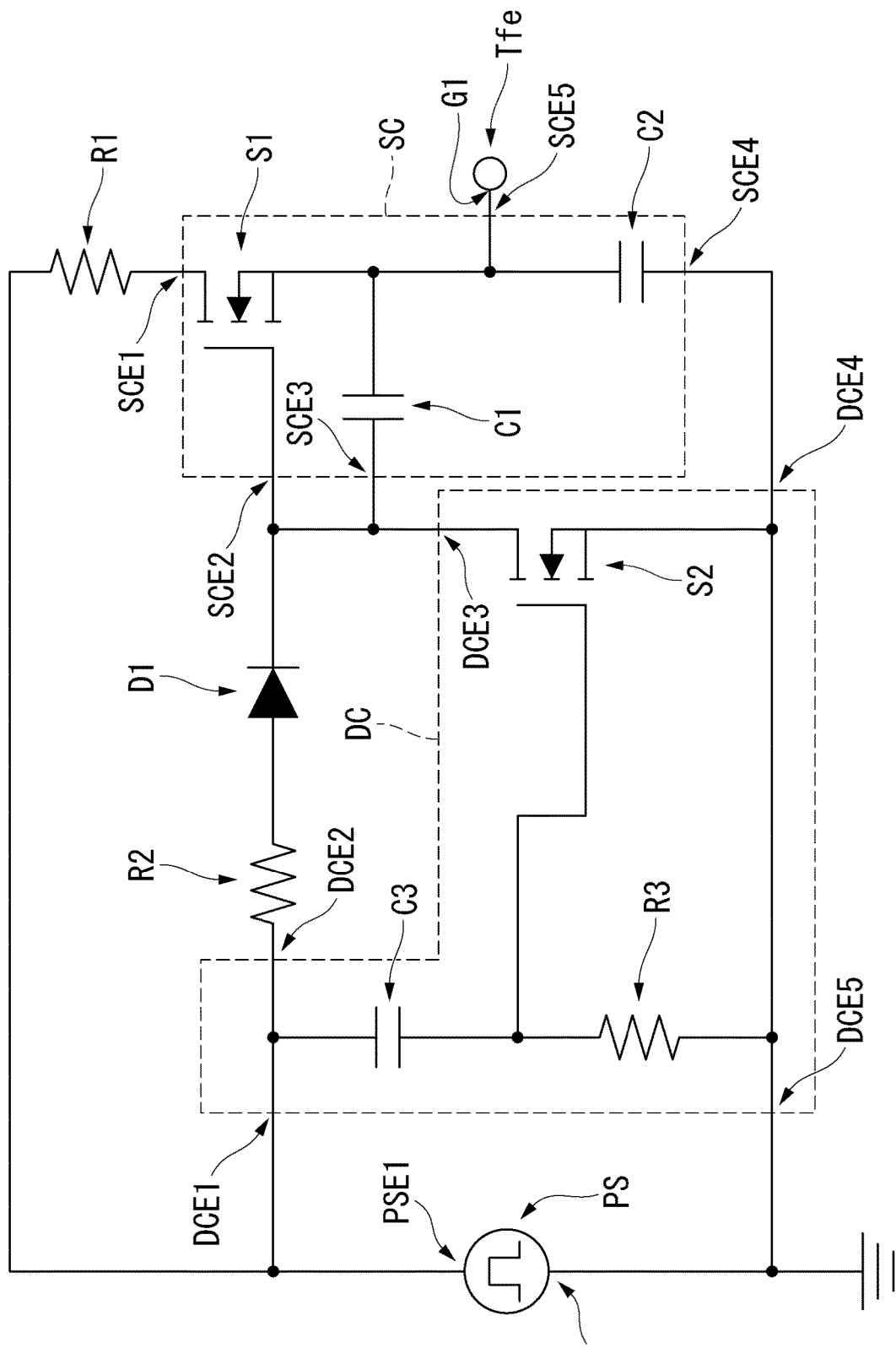
FIG. 1 is a diagram illustrating an example of the configuration of a drive circuit 1 according to an embodiment.

Hereinafter, the circuit configuration of a drive circuit 1 according to the embodiment will be described with reference to FIG. 1. FIG. 1 is a diagram illustrating an example of the configuration of the drive circuit 1 according to the embodiment.

The drive circuit 1 is an example of the drive circuit described above. In the example illustrated in FIG. 1, the drive circuit 1 is connected to a gate terminal G1 of the first field effect transistor Tfe. The first field effect transistor is a field effect transistor that drives a device to be controlled. The device to be controlled is a device that is a target controlled by the drive circuit 1. In other words, the drive circuit 1 is a circuit that drives the device to be controlled through the connected first field effect transistor.

For example, the device to be controlled is a motor. The device to be controlled may be another device that can be driven by the drive circuit 1 instead of the motor. In FIG. 1, in order to prevent complications of the drawing, a configuration of the first field effect transistor other than the gate terminal G1 is omitted.

The drive circuit 1, for example, includes a drive signal output circuit PS, a switching circuit SC, a resistive element R1, a resistive element R2, a delay circuit DC, and a reverse flow suppressing unit D1. The drive circuit 1 may be configured to include other elements, other circuits, other devices, and the like within a range in which the function of the drive circuit 1 to be described below is not damaged.

The drive signal output circuit PS includes a first terminal PSE1 and a second terminal PSE2. The switching circuit SC includes a first terminal SCE1, a second terminal SCE2, a third terminal SCE3, a fourth terminal SCE4, and a fifth terminal SCE5. The delay circuit DC includes a first terminal DCE1, a second terminal DCE2, a third terminal DCE3, a fourth terminal DCE4, and a fifth terminal DCE5.

The first terminal PSE1 of the drive signal output circuit PS is connected to one of two terminals of the resistive element R1 through a transmission path. In addition, the other of the two terminals of the resistive element R1 is connected to the first terminal SCE1 of the switching circuit SC through a transmission path.

The first terminal DCE1 of the delay circuit DC is connected to a transmission path connecting the drive signal output circuit PS and the resistive element R1 through another transmission path. The second terminal DCE2 of the delay circuit DC is connected to one of two terminals of the resistive element R2 through a transmission path. The other of the two terminals of the resistive element R2 is connected to one of two terminals of the reverse flow suppressing unit D1 through a transmission path. In addition, the other of the two terminals of the reverse flow suppressing unit D1 is connected to the second terminal SCE2 of the switching circuit SC through a transmission path. In the example illustrated in FIG. 1, the reverse flow suppressing unit D1 is a diode. For this reason, in this example, the resistive element R2 is connected to an anode of the reverse flow suppressing unit D1. In addition, in this example, the second terminal SCE2 of the switching circuit SC is connected to a cathode of the reverse flow suppressing unit D1.

The third terminal SCE3 of the switching circuit SC is connected to the third terminal DCE3 of the delay circuit DC through a transmission path. A transmission path connecting the reverse flow suppressing unit D1 and the second terminal SCE2 of the switching circuit SC is connected to a transmission path connecting the third terminal SCE3 of the switching circuit SC and the third terminal DCE3 of the delay circuit DC through another transmission path. In addition, the fourth terminal SCE4 of the switching circuit SC is connected to the fourth terminal DCE4 of the delay circuit DC through a transmission path. The fifth terminal DCE5 of the delay circuit DC is connected to the second terminal PSE2 of the drive signal output circuit PS through a transmission path. In addition, a transmission path connecting the fifth terminal DCE5 of the delay circuit DC and the second terminal PSE2 of the drive signal output circuit PS is grounded to the ground through another transmission path. The fifth terminal SCE5 of the switching circuit SC is connected to the gate terminal G1 of the first field effect transistor through a transmission path.

Here, the switching circuit SC includes a switching element S1, a capacitor C1, and a capacitor C2.

For example, the switching element S1 is a field effect transistor. In addition, the switching element S1 may be another transistor such as a bipolar transistor instead of a field effect transistor. The switching element S1 may be another switching element. Here, another switching element includes a signal terminal such as a gate terminal of the field effect transistor or a base terminal of a bipolar transistor to which a voltage for controlling switching of the other switching element is applied.

A gate terminal of the switching element S1 is connected to the second terminal SCE2 of the switching circuit SC through a transmission path. In addition, a drain terminal of the switching element S1 is connected to the first terminal SCE1 of the switching circuit SC through a transmission path. Furthermore, a source terminal of the switching element S1 is connected to the fifth terminal SCE5 of the switching circuit SC through a transmission path. A transmission path connecting the source terminal of the switching element S1 and the fifth terminal SCE5 of the switching circuit SC is connected to one of two terminals of the capacitor C2 through another transmission path. In addition, the other of the two terminals of the capacitor C2 is connected to the fourth terminal SCE4 of the switching circuit SC through a transmission path. A transmission path connecting the switching element S1 and the fifth terminal SCE5 of the switching circuit SC is connected to one of two terminals of the capacitor C1 through another transmission path. In addition, the other of two terminals of the capacitor C1 is connected to the third terminal SCE3 of the switching circuit SC through a transmission path.

The delay circuit DC includes a switching element S2, a capacitor C3, and a resistive element R3.

For example, the switching element S2 is a field effect transistor. In addition, the switching element S2 may be another transistor such as a bipolar transistor instead of a field effect transistor. The switching element S2 may be another switching element. Here, another switching element includes a signal terminal such as a gate terminal of a field effect transistor or a base terminal of a bipolar transistor to which a voltage for controlling switching of the other switching element is applied.

A gate terminal of the switching element S2 is connected to one of two terminals of the capacitor C3 through a transmission path. In addition, the other of the two terminals of the capacitor C3 is connected to the first terminal DCE1 of the delay circuit DC through a transmission path. A transmission path connecting the first terminal DCE1 of the delay circuit DC and the capacitor C3 is connected to the second terminal DCE2 of the delay circuit DC through another transmission path. A transmission path connecting the gate terminal of the switching element S2 and the capacitor C3 is connected to one of two terminals of the resistive element R3 through another transmission path. In addition, the other of the two terminals of the resistive element R3 is connected to the fifth terminal DCE5 of the delay circuit DC through a transmission path. A source terminal of the switching element S2 is connected to the fourth terminal DCE4 of the delay circuit DC through a transmission path. A transmission path connecting the fifth terminal DCE5 of the delay circuit DC and the resistive element R3 is connected to a transmission path connecting the source terminal of the switching element S2 and the fourth terminal DCE4 of the delay circuit DC through another transmission path. A drain terminal of the switching element S2 is connected to the third terminal DCE3 of the delay circuit DC through a transmission path.

Here, for example, the drive signal output circuit PS is an IC (Integrated Circuit) that outputs a pulse signal. In addition, the drive signal output circuit PS may be another circuit, another device, or the like that can output a pulse signal instead of an IC. The drive signal output circuit PS outputs a pulse signal input to the gate terminal G1 of the first field effect transistor from the first terminal PSE1 as a drive signal.

As illustrated in FIG. 1, the switching element S1 is connected between the gate terminal G1 of the first field effect transistor and the first terminal PSE1 of the drive signal output circuit PS. For this reason, the switching element S1 is a switching element that performs switching of a conduction state between the gate terminal G1 and the first terminal PSE1. In a case in which a gate voltage of the switching element S1 is equal to or higher than a predetermined threshold Vth1, the switching element S1 causes electrical conduction between the gate terminal G1 and the first terminal PSE1. In other words, in this case, the state of the switching element S1 is an on state. On the other hand, in a case in which the gate voltage of the switching element S1 is lower than the threshold Vth1, the switching element S1 causes electrical insulation between the gate terminal G1 and the first terminal PSE1. In other words, in this case, the state of the switching element S1 is an off state. Here, the threshold Vth1 is a value that is determined in accordance with characteristics of the switching element S1.

The capacitor C1 is a capacitor holding a predetermined static capacitance. The capacitor C1 applies a voltage corresponding to an electric charge accumulated in this static capacitance to the gate terminal of the switching element S1. Thus, this capacitance is a capacitance for applying a voltage corresponding to an electric charge accumulated in this static capacitance to the gate terminal of the switching element S1. In addition, in a case in which a parasitic capacitance of the switching element S1 is equal to or higher than the static capacitance of the capacitor C1, the switching circuit SC may be configured not to include the capacitor C1. The reason for this is that the parasitic capacitance of the switching element S1 functions in place of the static capacitance of the capacitor C1 in this case. Hereinafter, for the convenience of description, the static capacitance of the capacitor C1 and the parasitic capacitance of the switching element S1 together will be referred to as the static capacitance of the switching circuit SC.

The capacitor C2 causes a voltage corresponding to an electric charge accumulated in the parasitic capacitance of the switching element S1 and the static capacitance of the capacitor C1, to be equal to or higher than a predetermined threshold Vth1 in accordance with capacitance voltage division with the parasitic capacitance of the switching element S1, the static capacitance of the capacitor C1 and a voltage applied to the gate terminal of the switching element S1. In other words, the voltage applied to the gate terminal of the switching device S1 is divided by the composite capacitance of the parasitic capacitance of the switching device S1 and the capacitance of the capacitor C1, and the capacitance of the capacitor C2. As a result, the capacitor C2 causes the voltage above the predetermined threshold Vth1 in accordance with the charge accumulated in the parasitic capacitance of the switching device S1 and the capacitance of the capacitor C1. In a case in which parasitic capacitance between the gate terminal of the first field effect transistor and the source terminal of the first field effect transistor is sufficiently large, the switching circuit SC may be configured not to include the capacitor C2.

Here, there are cases in which a voltage of the third terminal SCE3 of the switching circuit SC becomes higher than a voltage of the first terminal PSE1 of the drive signal output circuit PS in accordance with the static capacitance of the switching circuit SC. In such cases, a reverse flow of a current from the third terminal SCE3 to the first terminal PSE1 is generated. In other words, in such cases, a reverse flow of a current from the static capacitance of the switching circuit SC to the drive signal output circuit PS is generated. The reverse flow suppressing unit D1 suppresses a reverse flow of the current from the static capacitance of the switching circuit SC to the drive signal output circuit PS. In the example illustrated in FIG. 1, as described above, the reverse flow suppressing unit D1 is a diode. In addition, the reverse flow suppressing unit D1 may be another element (for example, a switching element or the like) that can suppress a reverse flow of the current from the static capacitance of the switching circuit SC to the drive signal output circuit PS instead of the diode.

The delay circuit DC switches the state of the switching element S1 between the on state and the off state. More specifically, the delay circuit DC switches the state of the switching element S1 between the on state and the off state in accordance with the state of the switching element S2. In accordance with this, the delay circuit DC delays an input of a drive signal from the drive signal output circuit PS to the gate terminal G1 of the first field effect transistor.

In this way, the delay circuit DC and the reverse flow suppressing unit D1 are connected between the first terminal PSE1 and the gate terminal of the switching element S1.

By employing the circuit configuration as described above, the drive circuit 1 suppresses a drop of the voltage of the drive signal. Hereinafter, the operation of the drive circuit 1 will be described in more detail with reference to FIG. 2. The drive circuit 1 may be configured not to include at least one of the resistive element R1 and the resistive element R2.

<Operation of Drive Circuit>

Figure 2:
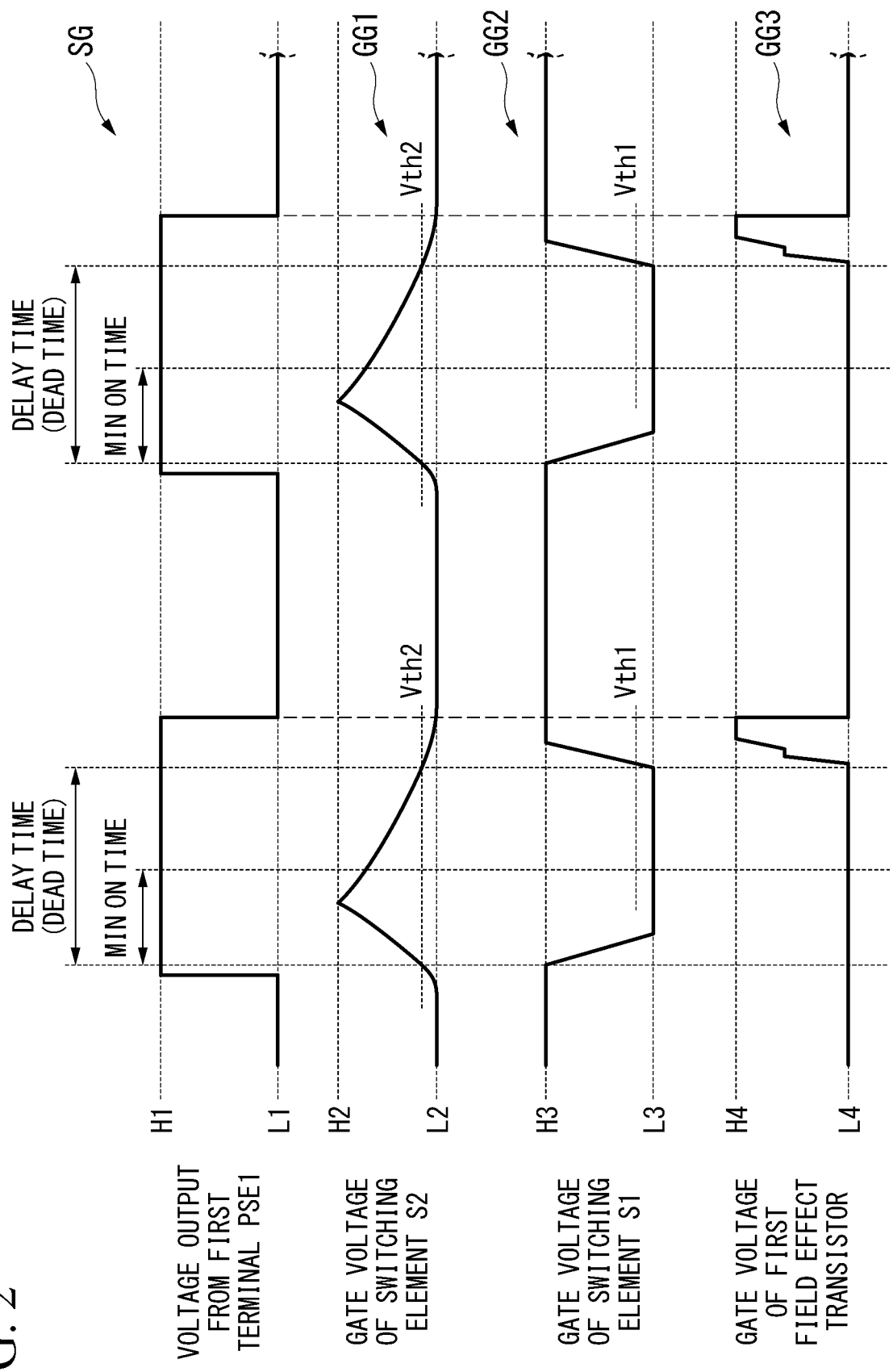
FIG. 2 is a diagram illustrating an example of a timing diagram at the time of operating the drive circuit 1.

FIG. 2 is a diagram illustrating an example of a timing diagram at the time of operating the drive circuit 1. In FIG. 2, a drive signal graph SG, a gate voltage graph GG1, a gate voltage graph GG2, and a gate voltage graph GG3 are sequentially aligned from top to bottom in FIG. 2. Here, the drive signal graph SG is a graph that represents changes of a voltage value of a pulse signal output as a drive signal from the first terminal PSE1 of the drive signal output circuit PS. The gate voltage graph GG1 is a graph that represents changes of a voltage value of the gate voltage of the switching element S2. The gate voltage graph GG2 is a graph that represents changes of a voltage value of the gate voltage of the switching element S1. The gate voltage graph GG3 is a graph that represents changes of a voltage value of the gate voltage of the first field effect transistor. In each of the drive signal graph SG, the gate voltage graph GG1, the gate voltage graph GG2, and the gate voltage graph GG3, the vertical axis represents a voltage value. In addition, in each of the drive signal graph SG, the gate voltage graph GG1, the gate voltage graph GG2, and the gate voltage graph GG3, the horizontal axis represents an elapsed time. In the gate voltage graph GG3, in order to clearly indicate the operation of the first field effect transistor, among changes of the voltage value of the gate voltage of the first field effect transistor, changes of a degree not exceeding a threshold of the voltage value are omitted. Here, the threshold is a voltage value of a boundary at which the state of the first field effect transistor is switched from the off state to the on state among voltage values of the gate voltage.

Hereinafter, for the convenience of description, a maximum value (for example, 4.5 [V]) of the voltage value in the drive signal graph SG will be referred to as a voltage value H1 in description. In addition, hereinafter, for the convenience of description, a minimum value of the voltage value in the drive signal graph SG will be referred to as a voltage value L1 in description. Hereinafter, for the convenience of description, a maximum value of the voltage value in the gate voltage graph GG1 will be referred to as a voltage value H2 in description. In addition, hereinafter, for the convenience of description, a minimum value of the voltage value in the gate voltage graph GG1 will be referred to as a voltage value L2 in description. Hereinafter, for the convenience of description, a maximum value of the voltage value in the gate voltage graph GG2 will be referred to as a voltage value H3 in description. In addition, hereinafter, for the convenience of description, a minimum value of the voltage value in the gate voltage graph GG2 will be referred to as a voltage value L3 in description. Hereinafter, for the convenience of description, a maximum value (for example, 3.5 [V] or more) of the voltage value in the gate voltage graph GG3 will be referred to as a voltage value H4 in description. In addition, hereinafter, for the convenience of description, a minimum value of the voltage value in the gate voltage graph GG3 will be referred to as a voltage value L4 in description.

In the drive circuit 1, as described above, in a case in which the voltage value of the gate voltage of the switching element S1 is equal to or larger than the threshold Vth1, the state of the switching element S1 is the on state. On the other hand, in a case in which the voltage value of the gate voltage of the switching element S1 is smaller than the threshold Vth1, the state of the switching element S1 is the off state. In addition, in the drive circuit 1, in a case in which the voltage value of the gate voltage of the switching element S2 is equal to larger than a threshold Vth2, the state of the switching element S2 is the on state. On the other hand, in a case in which this voltage value of the gate voltage of the switching element S2 is smaller than the threshold Vth2, the state of the switching element S2 is the off state. Then, in the drive circuit 1, when the drive signal output circuit PS outputs a drive signal, an electric charge is accumulated in the static capacitance of the switching circuit SC.

Here, in a case in which an electric charge is accumulated in the static capacitance of the switching circuit SC and in a case in which the state of the switching element S2 is the off state, there is no path in which the electric charge accumulated in the static capacitance of the switching circuit SC flows to the ground in the drive circuit 1. For this reason, in the drive circuit 1, in a case in which an electric charge is accumulated in the static capacitance of the switching circuit SC, the state of the switching element S1 is maintained to be the on state except for at the time of a rise of the gate voltage of the switching element S1 as long as the state of the switching element S2 is the off state. As a result, in the timing diagram illustrated in FIG. 2, in a case in which the voltage value of the gate voltage of the switching element S2 is smaller than the threshold Vth2, the voltage value of the gate voltage of the switching element S1 is maintained to be a voltage value H3 except for at the time of a rise of the gate voltage of the switching element S1.

In addition, in the drive circuit 1, the voltage value of the gate voltage of the switching element S2 of the delay circuit DC starts to increase in accordance with a rise of the output of the drive signal from the first terminal PSE1 using the drive signal output circuit PS. Then, when the voltage value of the gate voltage of the switching element S2 of the delay circuit DC becomes equal to larger than the threshold Vth2, the state of the switching element S2 becomes the on state. However, an increase in the voltage value of the gate voltage of the switching element S2 of the delay circuit DC occurs in accordance with an increase in a current flowing through the resistive element R3 through the capacitor C3 according to a high-frequency component of a drive signal output by the drive signal output circuit PS. For this reason, the voltage value of the gate voltage of the switching element S2 of the delay circuit DC starts to drop in accordance with start of a decrease in a high-frequency component passing through the capacitor C3 and a decrease in the current flowing through the resistive element R3. For such reasons, in FIG. 2, this voltage value of the gate voltage of the switching element S2 of the delay circuit DC changes in a convex shape within a period in which the voltage value exceeds the threshold Vth2. In FIG. 2, a period in which the state of the switching element S2 is the on state in accordance with passage of such a high-frequency component through the capacitor C3 is represented as a "DELAY TIME (DEAD TIME)". Hereinafter, for the convenience of description, the period will be referred to as a delay period in description.

In the drive circuit 1, the voltage value of the gate voltage of the switching element S1 decreases to a voltage value L3 in accordance with a rise of the voltage value of the gate voltage of the switching element S2. As a result, the state of the switching element S1 becomes the off state. For this reason, within the delay period, the state of the switching element S1 is maintained to be the off state except for at the time of a rise of the voltage value of the gate voltage of the switching element S2. Here, the delay period starts in accordance with a rise of the output of a drive signal from the first terminal PSE1 that is performed by the drive signal output circuit PS. In other words, in a case in which the drive signal output circuit PS outputs a drive signal, the drive circuit 1 maintains the voltage value of the gate voltage of the first field effect transistor to be a voltage value L4 until the delay period elapses from a timing at which the drive signal is output. In other words, the drive circuit 1 delays an input of a drive signal to the gate terminal of the first field effect transistor until the delay period elapses from the timing.

Then, after the delay period, the voltage value of the gate voltage of the switching element S2 becomes smaller than the threshold Vth2. For this reason, the voltage value of the gate voltage of the switching element S1 increases to the voltage value H3. As a result, the voltage value of the gate voltage of the first field effect transistor exceeds the threshold Vth1 and increases to a voltage value H4. As a result, after the delay period elapses, the drive circuit 1 inputs a pulse signal of a voltage having the voltage value H4 to the gate terminal G1 of the first field effect transistor. In the drive circuit 1, a period in which the voltage value of the gate voltage of the first field effect transistor is maintained to be the voltage value H4 can be adjusted by adjusting a pulse width of the drive signal output from the drive signal output circuit PS. In other words, by adjusting the pulse width, the drive circuit 1 can input a drive signal of which a pulse width is adjusted to a desired pulse width to the gate terminal G1 of the first field effect transistor. Hereinafter, a drive signal after adjustment of the pulse width to a desired pulse width will be referred to as an effective drive signal in description.

In addition, when a current reversely flows from the static capacitance of the switching circuit SC to the drive signal output circuit PS, the voltage of the effective drive signal drops. As a result, even when an effective drive signal is input to the gate terminal G1, there are cases in which the state of the first field effect transistor does not become the on state. However, in the drive circuit 1, a current is suppressed from reversely flowing from the static capacitance of the switching circuit SC to the drive signal output circuit PS by the reverse flow suppressing unit D1. In other words, in the drive circuit 1, there is no drop of the voltage of the effective drive signal in accordance with a reverse flow of the current from the static capacitance of the switching circuit SC to the drive signal output circuit PS. As a result, the drive circuit 1 can suppress the state of the first field effect transistor from not being able to be switched from the off state to the on state at a desired timing.

In this way, the drive circuit 1 can suppress a drop of a voltage of the effective drive signal. As a result, for example, even in a case in which the voltage value of the voltage of the drive signal is low, the drive circuit 1 inhibits missing of pulses and can switch the state of the first field effect transistor from the off state to the on state at a desired timing.

In addition, in a drive circuit different from the drive circuit 1, for example, a drive signal is generated by an IC such as the drive signal output circuit PS. However, a minimum pulse width that can be generated by the IC is individually determined in accordance with characteristics of the IC. For this reason, the drive circuit may supply excessive electric power to a device driven by the drive circuit. As a result, a malfunction may occur in the device. In contrast to this, as described above, the drive circuit 1 can input an effective drive signal having a desired pulse width to the gate terminal G1 of the first field effect transistor. In other words, this means that the drive circuit 1 can input a pulse signal shorter than a pulse signal having a minimum pulse width that can be generated by the drive signal output circuit PS to the gate terminal G1 as an effect drive signal. As a result, the drive circuit 1 can inhibit supply of excessive electric power to a device driven by the first field effect transistor. In FIG. 2, a period represented by "MIN ON TIME" illustrates one example of a minimum pulse width that can be generated by the drive signal output circuit PS. For this reason, in the example illustrated in FIG. 2, the pulse width of the effective drive signal is a pulse width that is shorter than a minimum pulse width that can be generated by the drive signal output circuit PS.

In accordance with the configuration and the operation as described above, the drive circuit 1 can suppress a drop of the voltage of the drive signal. In addition, the drive circuit 1 can be also regarded as a circuit that performs generation of an effective drive signal and supply of the effective drive signal to the gate terminal G1 of the first field effect transistor using two pulse signals including a pulse signal passing through a transmission path connecting the first terminal PSE1 of the drive signal output circuit PS and the first terminal SCE1 of the switching circuit SC and a pulse signal passing through a transmission path connecting the first terminal PSE1 and the first terminal DCE1 of the delay circuit DC. When regarded as such, the drive circuit 1 according to this embodiment is an example of the drive circuit 1 in a case in which these two pulse signals are generated by causing them to branch from one pulse signal. In this case, these two pulse signals may be output from signal sources that are different from each other.

In addition, by performing adjustment of the delay period using the delay circuit DC and adjustment of the pulse width of the drive signal using the drive signal output circuit PS, for example, the drive circuit 1 described above can output a drive signal having a desired pulse width to a device to be controlled while being synchronized with a signal output from another circuit.

As above, according to an embodiment, there is provided a drive circuit (in the example illustrated above, the drive circuit 1) including: a drive signal output circuit (in the example described above, the drive signal output circuit PS) configured to output a pulse signal input to a gate terminal (in the example illustrated above, the gate terminal G1) of a first field effect transistor driving a device, which is a target to be controlled (in the example illustrated above, the device to be controlled), from a signal output terminal (in the example illustrated above, the first terminal PSE1) as a drive signal; a switching circuit (in the example illustrated above, the switching circuit SC) having a switching element (in the example illustrated above, the switching element S1) that is connected between the gate terminal and the signal output terminal and configured to switch a conduction state between the gate terminal and the signal output terminal, the switching circuit a holding a static capacitance (in the example described above, the static capacitance of the switching circuit SC) for applying a voltage corresponding to an accumulated electric charge to a signal terminal (in the example described above, the gate terminal of the switching element S1 or the base terminal of the switching element S1) of the switching element; a delay circuit (in the example described above, the delay circuit DC) configured to delay an input of the drive signal to the gate terminal by switching a state of the switching element between an on state and an off state; and a reverse flow suppressing unit (in the example described above, the reverse flow suppressing unit D1) configured to suppress a reverse flow of a current from the static capacitance to the drive signal output circuit. In accordance with this, the drive circuit can suppress a drop of a voltage of the drive signal.

In addition, in the drive circuit, a configuration in which the switching element is a second field effect transistor (in the example described above, the switching element S1 in the case of the field effect transistor), and the signal terminal is a gate terminal of the second field effect transistor may be used.

In addition, in the drive circuit, a configuration in which the switching element is a transistor (in the example described above, the switching element S1 in the case of a transistor such as a bipolar transistor that is different from the field effect transistor), and the signal terminal is a base terminal of the transistor may be used.

In addition, in the drive circuit, a configuration in which the switching circuit has a capacitor (in the example described above, the capacitor C1) that is separate from the switching element, and the static capacitance of the switching circuit includes a static capacitance of the capacitor may be used.

In addition, in the drive circuit, a configuration in which the static capacitance of the switching circuit includes parasitic capacitance of the switching element may be used.

In addition, in the drive circuit, a configuration in which the delay circuit and the reverse flow suppressing unit is connected between the signal output terminal and the signal terminal, and the reverse flow suppressing unit is a diode may be used.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the

EXPLANATION OF REFERENCES

1 Drive circuit
Tfe First field effect transistor
C1, C2, C3 Capacitor
D1 Reverse flow suppressing unit
DC Delay circuit
DCE1, SCE1 First terminal
DCE2, SCE2 Second terminal
DCE3, SCE3 Third terminal
DCE4, SCE4 Fourth terminal
DCE5, SCE5 Fifth terminal
G1 Gate terminal
GG1, GG2, GG3 Gate voltage graph
H1, H2, H3, H4, L1, L2, L3, L4 Voltage value
PS Drive signal output circuit
PSE1 First terminal
PSE2 Second terminal
R1, R2, R3 Resistive element
S1, S2 Switching element
SC Switching circuit
SG Drive signal graph
Vth1, Vth2 Threshold

What is claimed is:

1. A drive circuit comprising:
    a drive signal output circuit configured to output a first pulse signal branched from a pulse signal and a second pulse signal branched from the pulse signal;
    a switching circuit configured to input the first pulse signal from the drive signal output circuit;
    a delay circuit configured to input the second pulse signal from the drive signal output circuit; and
    a reverse flow suppressing unit,
    wherein the switching circuit (1) connects the drive signal output circuit and a gate terminal of a first field effect transistor driving a device, the device being a target to be controlled, (2) has a switching element that has a first terminal to which the first pulse signal is input from the drive signal output circuit, a second terminal outputting the first pulse signal to the gate terminal, and a control terminal controlling a conduction state between the first terminal and the second terminal, and (3) has a capacitance on the second terminal and the control terminal,
    the delay circuit connects the drive signal output circuit and the control terminal, and outputs the second pulse signal delayed to the control terminal from the drive signal output circuit through the reverse flow suppressing unit, and
    the reverse flow suppressing unit connects the drive signal output circuit and the control terminal, and suppress a reverse flow of a current to the drive signal output circuit from the control terminal.

2. The drive circuit according to claim 1,
    wherein the switching element is a second field effect transistor, and
    wherein the control terminal is a gate terminal of the second field effect transistor.

3. The drive circuit according to claim 1,
    wherein the switching element is a transistor, and
    wherein the control terminal is a base terminal of the transistor.

4. The drive circuit according to claim 1,
    wherein the switching circuit has a capacitor that is separate from the switching element, and
    wherein the capacitance of the switching circuit includes a static capacitance of the capacitor.

5. The drive circuit according to claim 2,
    wherein the switching circuit has a capacitor that is separate from the switching element, and
    wherein the capacitance of the switching circuit includes a static capacitance of the capacitor.

6. The drive circuit according to claim 3,
    wherein the switching circuit has a capacitor that is separate from the switching element, and
    wherein the capacitance of the switching circuit includes a static capacitance of the capacitor.

7. The drive circuit according to claim 1,
    wherein the capacitance of the switching circuit includes parasitic capacitance of the switching element.

8. The drive circuit according to claim 2,
    wherein the capacitance of the switching circuit includes parasitic capacitance of the switching element.

9. The drive circuit according to claim 3,
    wherein the capacitance of the switching circuit includes parasitic capacitance of the switching element.

10. The drive circuit according to claim 4,
    wherein the capacitance of the switching circuit includes parasitic capacitance of the switching element.

11. The drive circuit according to claim 5,
    wherein the capacitance of the switching circuit includes parasitic capacitance of the switching element.

12. The drive circuit according to claim 6,
    wherein the capacitance of the switching circuit includes parasitic capacitance of the switching element.

13. The drive circuit according to claim 1,
    wherein the reverse flow suppressing unit is a diode.

14. The drive circuit according to claim 2,
    wherein the reverse flow suppressing unit is a diode.

15. The drive circuit according to claim 3,
    wherein the reverse flow suppressing unit is a diode.

16. The drive circuit according to claim 4,
    wherein the reverse flow suppressing unit is a diode.

17. The drive circuit according to claim 5,
    wherein the reverse flow suppressing unit is a diode.

18. The drive circuit according to claim 6,
    wherein the reverse flow suppressing unit is a diode.

19. The drive circuit according to claim 7,
    wherein the reverse flow suppressing unit is a diode.

20. The drive circuit according to claim 12,
    wherein the reverse flow suppressing unit is a diode.

* * * * *